(12) United States Patent
Feldhaus et al.

(10) Patent No.: US 10,436,826 B2
(45) Date of Patent: Oct. 8, 2019

(54) TEST AND MEASUREMENT DEVICE, METHOD FOR CALIBRATING A TEST AND MEASUREMENT DEVICE AS WELL AS METHOD FOR ANALYZING A HIGH BANDWIDTH OF A RADIO FREQUENCY SIGNAL

(71) Applicant: Rohde & Schwarz GmbH & Co. KG, Munich (DE)

(72) Inventors: Gregor Feldhaus, Munich (DE); Alexander Roth, Dorfen (DE); Matthias Ruengeler, Markt Schwaben (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 113 days.

(21) Appl. No.: 15/419,833

(22) Filed: Jan. 30, 2017

(65) Prior Publication Data

US 2018/0217189 A1 Aug. 2, 2018

(51) Int. Cl.
*G01R 23/16* (2006.01)
*G01R 35/00* (2006.01)
*G01R 13/02* (2006.01)
*G01R 19/25* (2006.01)

(52) U.S. Cl.
CPC ......... *G01R 23/16* (2013.01); *G01R 13/0272* (2013.01); *G01R 19/2509* (2013.01); *G01R 35/005* (2013.01)

(58) Field of Classification Search
CPC .. G01R 23/16; G01R 29/0835; G01R 31/002; G01R 31/021; G01R 35/005; H05K 9/0069

USPC ...... 702/75, 85, 189, 190, 191, 192; 342/21; 324/617, 620; 375/E1.002, 247; 455/561
See application file for complete search history.

(56) References Cited

U.S. PATENT DOCUMENTS

| | | | | |
|---|---|---|---|---|
| 5,748,683 A | * | 5/1998 | Smith | H01Q 3/2605 375/347 |
| 6,344,749 B1 | * | 2/2002 | Williams | G01R 31/021 324/620 |
| 6,363,262 B1 | * | 3/2002 | McNicol | H04B 1/0003 375/E1.002 |
| 6,433,671 B1 | * | 8/2002 | Nysen | G01S 13/755 340/10.1 |
| 7,298,206 B2 | | 11/2007 | Pickerd et al. | |
| 7,519,513 B2 | | 4/2009 | Pupalaikis et al. | |
| 9,326,174 B1 | | 4/2016 | Dark et al. | |
| 2016/0291056 A1 | | 3/2016 | Cirillo et al. | |

(Continued)

*Primary Examiner* — John H Le
(74) *Attorney, Agent, or Firm* — Schwabe, Williamson & Wyatt, P.C.

(57) ABSTRACT

A test and measurement device is described that includes a radio frequency input for receiving a radio frequency signal, a mixer to mix the radio frequency signal into a first intermediate frequency signal, a splitter to split the first intermediate frequency signal into several split signals, several signal paths for processing the several split signals, and a recombiner that is configured to recombine the split signals in order to create an output signal having a frequency span substantially representing the one of the radio frequency signal. Further, a method for calibrating a test and measurement device and a method for analyzing a high bandwidth of a radio frequency signal are described.

18 Claims, 5 Drawing Sheets

(56) References Cited

U.S. PATENT DOCUMENTS

2016/0259586 A1 9/2016 Tylik
2016/0084940 A1 10/2016 Pickerd et al.

* cited by examiner

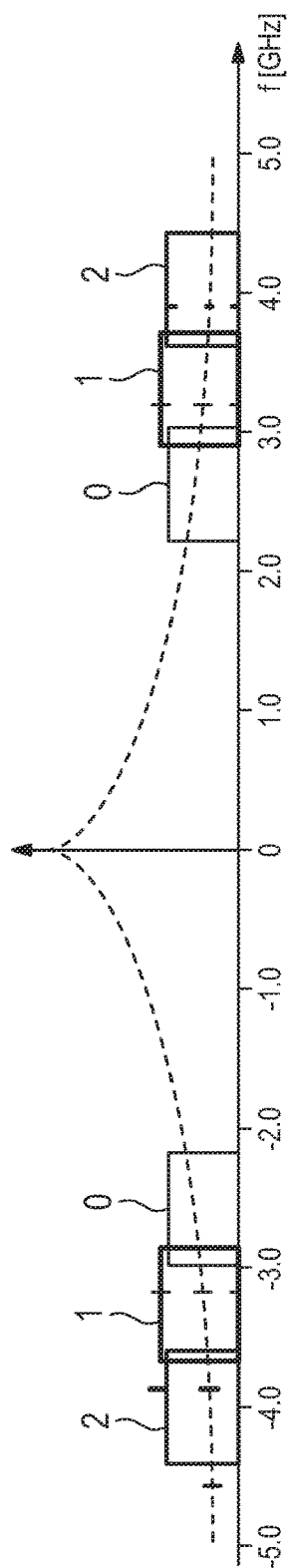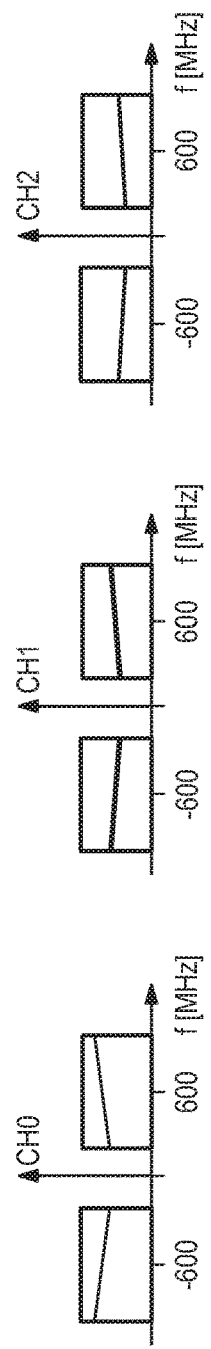

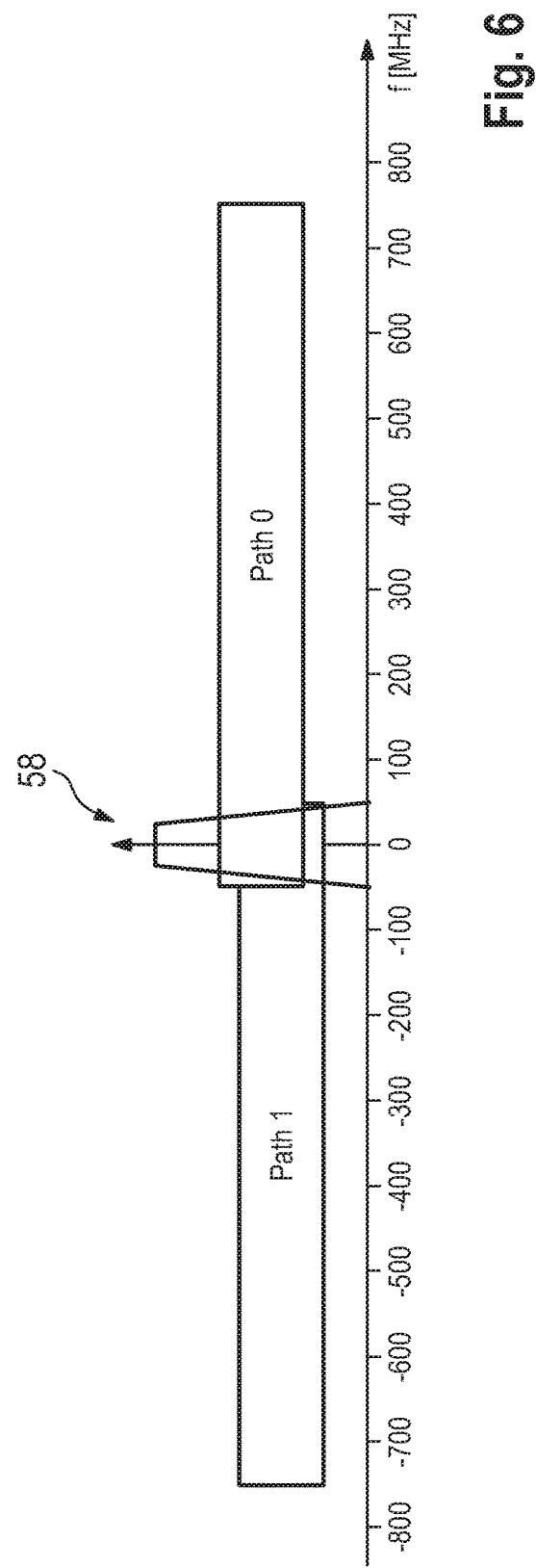

TEST AND MEASUREMENT DEVICE, METHOD FOR CALIBRATING A TEST AND MEASUREMENT DEVICE AS WELL AS METHOD FOR ANALYZING A HIGH BANDWIDTH OF A RADIO FREQUENCY SIGNAL

TECHNICAL FIELD

The invention relates to a test and measurement device, a method for calibrating a test and measurement device as well as a method for analyzing a high bandwidth of a radio frequency signal.

BACKGROUND OF THE INVENTION

In the state of the art, test and measurement devices are known that can be used for analyzing radio frequency signals. For instance, such a test and measurement device is a signal analyzer that usually comprises at least one analog to digital converter (ADC). Typically, the choice of the analog to digital converter used in the test and measurement device is a trade off between bandwidth and dynamics since a single analog to digital converter offers either a large number of bits at lower sample frequencies or a low number of bits at higher sample frequencies.

In the state of the art, two different methods are known to overcome the above mentioned issue wherein the bandwidth is enlarged by combining multiple analog to digital converters. These methods are called time-interleaving and frequency-interleaving methods. Both methods use multiple analog to digital converters in parallel wherein each analog to digital converter has a lower sample rate than required to sample the input signal.

In the time-interleaving method, the analog to digital converters sample the signal at different time instances such that the outputs of the converters are time-multiplexed in the digital domain to reconstruct the original signal. However, the main disadvantage of this method is the sensitivity to jitter. Thus, imaged spurs may occur in the recombined spectrum. In addition, the spurious free dynamic range (SFDR) is decreased.

On the other hand, the frequency-interleaving method uses an analog filter bank to divide the radio frequency signal into several sub-bands wherein each sub-band can be sampled at a lower sample rate. Then, the several sub-bands are forwarded to analog to digital converters in order to process these sub-bands digitally. In the digital domain, the different converter outputs are filtered, shifted back in frequency to their original position and added to reconstruct the original spectrum. Typically analog filters, for instance analysis filters, are used that are configured to cut a specific Nyquist band for a subsequent sub-sampling analog to digital converter. The original span is reconstructed by upsampling the corresponding band that has been filtered out by the filters previously, filtering the specific Nyquist band and adding the several subbands. However, the frequency responses of the filters are not known exactly and may change over time. In addition, delay and gain differences between the different sub-bands have to be considered by the synthesis filters appropriately. Accordingly, the reconstructed output signal may vary with regard to the original spectrum. Further, the frequency-interleaving method without mixers cannot be applied for radio frequency spans having a high center frequency.

Accordingly, there is a need for a test and measurement device as well as a method that are easy to use and that are able to provide improved characteristics with regard to the spurious free dynamic range and the output characteristics, in particular for signals having a high bandwidth.

SUMMARY OF THE INVENTION

The invention provides a test and measurement device comprising a radio frequency input for receiving a radio frequency signal, a radio frequency converter to mix said radio frequency signal into a first intermediate frequency signal, a splitter to split said first intermediate frequency signal into several split signals, several signal paths for processing said several split signals, and a recombiner that is configured to recombine said split signals in order to create an output signal having a frequency span substantially representing the one of said radio frequency signal.

Further, the invention provides a method for analyzing a high bandwidth of a radio frequency signal, with the following steps:

a) Providing a radio frequency signal;
b) Mixing said radio frequency signal to a first intermediate frequency signal;
c) Splitting said first intermediate frequency signal into several split signals; and
d) Combining said several split signals together in order to create an output signal having a frequency span substantially representing the one of said radio frequency signal.

The invention is based on the finding that the test and measurement device is formed easier and at reasonable costs since complex filtering techniques are not required to avoid image rejection problems effectively which will inevitable occur when the radio frequency signal is split directly into several split signals used for providing sub-bands. According to the invention, the radio frequency signal is initially mixed down to the first intermediate frequency signal wherein this first intermediate frequency signal is fixed. Accordingly, the fixed intermediate frequency signal is split by the splitter into several split signals. The following components may have a simpler design such that the costs can be reduced appropriately. For instance, mixers having a constant frequency can be used instead of mixers having a variable frequency that are required when a radio frequency signal is split. In addition, fixed bandpass filters can be used instead of frequency-variable bandpass filters that would be required due to image rejection problems. Moreover, it is easier to find components that can be used for processing an input radio frequency signal having a bandwidth being about 2 GHz or even higher since the radio frequency signal typically has a frequency between 0 and 85 GHz. In general, the several signal paths are fed with signals having a fixed intermediate frequency. The radio frequency signal may be an analog radio frequency signal. Accordingly, the radio frequency input of the test and measurement device is also an analog one.

According to an aspect, a first filter set is provided, said first filter set comprising several first filters each provided in a corresponding signal path of said several signal paths, said several first filters each being configured to filter a portion of the bandwidth of said split signals. These filters can be established by fixed bandpass filters having steep slopes to filter out the respective parts of the complete bandwidth that has been down-converted by the radio frequency converter, particularly mixed down into the first intermediate frequency. Generally, filters having a fixed frequency or filtering on a fixed frequency suppress the corresponding image frequencies effectively. The first filters may be different with respect to each other ensuring that different sub-bands of the first intermediate frequency signal may be generated.

Particularly, each first filter is configured to filter out a portion of the bandwidth of said split signal in order to obtain a sub-band such that each sub-band has a fraction of the bandwidth of said first intermediate frequency signal being different to the fractions of the other sub-bands, each fraction overlapping with at least one fraction of another sub-band partly. The several sub-bands generated by the first filters correspond to analog signals. The split signals passing the first filters are filtered in an analog domain of the test and measurement device such that only a certain frequency range can pass the different controlled first filters. The first filters are different with regard to the frequency range that is allowed to pass. The overlapping fractions of the different frequency ranges ensure that the split signals can be combined such that no information gets lost. Thus, a frequency span can be recombined that substantially represent the one of the input signal. In addition, the overlapping fractions can be used for calibration purposes, in particular calibrating with regard to phase differences.

According to another aspect, a first set of mixers is provided, said first set of mixers comprising several first mixers each provided in a corresponding signal path of said several signal paths, said several mixers each being configured to mix said split signals into second intermediate frequency signals. The first mixers are arranged downstream the first filters such that the different sub-bands being provided by the first filters each are mixed down into said second intermediate frequency. The different sub-bands relating to different portions of the radio frequency signal with regard to the bandwidth are converted into signals having the same center frequency, namely the second intermediate frequency. The first mixers may be formed by local oscillators that are coupled to a common reference. Furthermore, the first mixers are phase locked ensuring that the phases do not drift over time. Particularly, the first mixers are pre-calibrated wherein the calibration remains valid for the complete operation of the test and measurement device, namely an ON-cycle. The second intermediate frequency may be a frequency that shifts the complete subspan to lie within the first Nyquist band of the subsequent analog to digital converter.

Further, a second filter set may be provided, said second filter set comprising several second filters each provided in a corresponding signal path of said several signal paths, said several second filters each being configured to filter images and to limit the bandwidth of said split signals. The second filters are arranged downstream the first mixers such that the sub-bands mixed to the second intermediate frequency are filtered by the second filters. The second filters also ensure that the bandwidth of each split signal is limited as being required for an analog to digital converter that may be connected with the second filter respectively, in particular located downstream the second filter.

According to another aspect, a set of analog to digital converters is provided, said set of analog to digital converters comprising several analog to digital converters each provided in a corresponding signal path of said several signal paths, said several analog to digital converters each being configured to receive said split signals and to digitize said split signals, in particular said split signals being output from said several second filters each assigned to a corresponding analog to digital converter of said several analog to digital converters. As the analog to digital converters are arranged downstream the second filters, the sub-bands are digitized that have been down-converted to the second intermediate frequency and limited by the second filters previously. The second filters located upstream the analog to digital converters ensure that the analog to digital converters can process the split signals appropriately. The digitized split signals are processed further for digital processing within the test and measurement device. For instance, the split signals may be processed by the analog to digital converter with a sample rate being in the range of the bandwidth of the first intermediate frequency signal.

Generally, the radio frequency signal is mixed down into the first intermediate frequency signal that is split into several split signals afterwards. Then, these split signals may be processed in the analog domain prior to their digitization, for instance filtered and shifted down to a second intermediate frequency signal having a frequency being lower than the one of the first intermediate frequency signal.

According to another aspect, a third filter set is provided, said third filter set comprising several third filters being programmable, said third filters each being provided in a corresponding signal path of said several signal paths, said several third filters each being configured to correct said split signals in magnitude and phase, in particular wherein said third filters are calibrated via a comb generator. The third filters may be provided in a digital domain, for instance being established by equalizers that can be set in a simple manner. Usually, the programmable filters are used to compensate any frequency responses that occur in the respective analog signal path portions. In addition, the time delay and gain differences between the split signals processed by the different signal paths can be compensated easily due to the programmable filters.

Generally, the digital domain of the test and measurement device can be established by a field programmable gate array (FPGA).

Another aspect provides a second set of mixers, said second set of mixers comprising several second mixers each provided in a corresponding signal path of said several signal paths, said several second mixers each being configured to mix said split signals into baseband. The second mixers may be positioned downstream the third filters. The second mixers shift the frequency of the split signals from the second intermediate frequency back to the complex baseband. Alternatively, the second set of mixers may be positioned upstream the third set of filters. Thus, the third filters each filter a split signal being shifted back in the complex baseband.

According to another aspect, a fourth filter set is provided, said fourth filter set comprising several fourth filters each being provided in a corresponding signal path of said several signal paths, said several fourth filters each being configured to remove side-bands and to form signal overlap areas. Thus, the fourth filters prepare said split signals for being recombined with the other split signals processed in the other signal paths. The fourth filters may be established by synthesis filters. The fourth filters can also be called interpolation filters that might be associated with an upsampling. The fourth filters may form different spectra having an overlap area of 100 MHz with each other according to a certain embodiment. This overlap area corresponds to the fraction provided by the first filters. Further, each fourth filter has a slope being finite wherein each fourth filter is symmetrical around the limits of each signal path. The sum of the frequency spectra passed the shifted synthesis filters may exhibit a perfectly flat magnitude over the complete signal bandwidth when each spectrum is shifted to its correct baseband position in the spectrum substantially representing the one of the input signal. Generally, the fourth filters are used separately with regard to the other filters such that a separate filter step is provided in the digital domain wherein the unused side-bands are removed. Accordingly, equalization is simplified in the digital domain.

Particularly, an upsampler is provided prior to each fourth filter, said upsampler being configured to upsample said corresponding split signal prior to its recombination. The upsamplers are necessary if the analog to digital converters work with a sample rate that is lower than the bandwidth of the first intermediate frequency signal that is processed by the test and measurement device. Provided that the analog to digital converters work with a lower sample rate, the upsamplers will be used in conjunction with the fourth filters in order do adept the sample rate to the full signal bandwidth.

The fourth filters may be independent with regard to the analog domain due to the third filters being located between the analog domain and the fourth filters. Accordingly, the fourth filters can remain constant such that no adaption is required.

In contrast to the fourth filters, the third filters may be adapted with regard to changes that might occur in the analog domain. However, the third filters established by the equalization filters can be adapted in an easy and fast manner such that the whole processing is faster and less complex.

The digital domain may comprise inter alia the third and fourth filters. Thus, two different digital filters are provided performing different filtering steps in the digital domain. Each signal path comprises a digital filter unit that is split into two different filters, namely the third filter and fourth filter. The third and fourth filters may be established by an equalizer filter and a synthesis filter, respectively. Hence, the equalization is simplified such that the whole filtering process in the digital domain is faster and less complex, in particular the equalization.

Furthermore, a third set of mixers may be provided, said third set of mixers comprising several third mixers each provided in a corresponding signal path of said several signal paths, said several third mixers each being configured to convert said split signals to their original baseband positions with regard to the other split signals processed in the other signal paths and the radio frequency signal. Accordingly, the split signals are shifted back to their original positions within the total spectrum of the output signal substantially representing the one of the input signal. Thus, the shifting and filtering that have been performed by the first mixers and the second filters prior to the digital domain are substantially reversed by the third mixers. Particularly, the third mixers are positioned upstream the recombiner such that the split signals are shifted back to their original positions right before the split signals are recombined to the output signal representing the spectrum of the input signal.

According to a certain embodiment, at least said several signal paths are formed on a common single circuit board. Accordingly, several different vector spectrum analyzers are not required for analyzing a radio frequency signal having a high bandwidth as the different signal paths are formed on the same circuit board. Thus, a single unit representing the test and measurement device is provided that can be used for analyzing a high bandwidth of a radio frequency signal.

With regard to the method for analyzing a high bandwidth, said split signals may be filtered to limit the bandwidth of each split signal to a portion of the bandwidth of said first intermediate frequency signal, each portion overlapping partly with a portion of an adjacent split signal with regard to the frequency, in particular wherein said split signals each are mixed down to a second, lower intermediate frequency. Hence, the radio frequency signal having a high bandwidth is initially mixed down to the first intermediate frequency signal that is split such that several split signals are provided being first intermediate frequency signals. These split signals are then filtered in order to limit the bandwidth of each split signal such that each split signal corresponds to a certain sub-band of the first intermediate frequency signal. The first filters are formed such that a certain overlap between the different sub-bands is provided, in particular between sub-bands being adjacent to each other. This overlap may be used for calibration purposes. Afterwards, said split signals having a limited bandwidth are mixed down to a second, lower intermediate frequency. Thus, the different sub-bands are shifted to a common second intermediate frequency being lower than the first intermediate frequency for further processing, in particular for digitization.

Further, said split signals are filtered in order to filter images of each split signal and to limit the bandwidth of each split signal and/or wherein each of said split signals is digitized. The images of each split signal are filtered after the sub-bands have been mixed down to the second intermediate frequency. In addition, the bandwidth of each split signal is limited ensuring that the complete signal can be converted by using analog to digital converters. After the filtering step, the split signals are digitized such that the split signals can be processed in the digital domain.

Moreover, said split signals each may be filtered using a programmable filter in order to correct said split signals with regard to magnitude and phase, in particular wherein in a separate filter step unused side-bands are removed from said split signals and/or signal overlap areas are formed. These steps are done in preparation of recombining said split signals. Thus, the programmable filters are used in a different filter step than the filters that are configured to remove unused side-bands and/or form signal overlap areas. Generally, the programmable filters may be established by equalizers that are configured to correct magnitude and phase. Particularly, the several programmable filters are connected to each other such that they compensate gain differences and time delay between the different split signals forwarded via the signal paths. The separate filter step may be performed prior to the recombination step in which the several split signals are recombined to the output signal.

In addition, each of said split signals may be mixed in order to correct their baseband positions relative to the other split signals. Thus, the split signals are shifted back to their original positions with respect to each other. This ensures that the spectrum of the output signal represents the one of the radio frequency signal that has been input initially.

Further, the invention provides a method for calibrating a test and measurement device, in particular a test and measurement device as mentioned above, with the following steps:
a) Sending an intermediate frequency comb signal to several signal paths of said device;
b) Measuring a phase difference between the signals of each pair of adjacent signal paths in an overlap area of said signals processed in said adjacent signal paths with regard to the bandwidth of said signals; and
c) Correcting said phase difference using a set of mixers and/or a filter set.

Accordingly, the invention provides a method that can be used for calibrating the test and measurement device in an easy and fast manner, in particular for phase differences between local oscillators that are used as mixers. The intermediate frequency comb signal can be input to the test and measurement device downstream a radio frequency converter that mixes the radio frequency signal into a first intermediate frequency signal. This ensures that any influences of the radio frequency converter do not affect the calibrating process that uses an intermediate frequency signal for calibration purposes. Particularly, the setting of the radio frequency converter can be maintained during the calibration process. The intermediate frequency comb signal may be split into different signals processed by the different signal paths wherein these different signals are processed such that an overlap area with regard to the bandwidth is provided between the signals processed by adjacent signal paths. These overlap areas can be used for gaining information regarding any phase differences between adjacent signal paths, in particular the signals processed in adjacent signal paths. As already mentioned, adjacent signal paths are signal paths that process split signals that correspond to sub-bands being neighbored in the whole spectrum.

According to an aspect, said correcting is performed by adjusting the phase of mixers belonging to said set of mixers, in particular wherein said mixers are numerically controlled. The mixers may be local oscillators each having a certain phase characteristic such that the phase characteristics of the different mixers have to be set appropriately. For calibration purposes, the phases of the mixers are adjusted appropriately.

According to another aspect, said correcting is performed by changing phase coefficients of filters belonging to said filter set. The test and measurement device may also comprise filters that are used for processing the radio frequency signal, in particular split signals of the input radio frequency signal. These filters also have an influence on the phase information. Accordingly, the phase coefficients of the filters used for processing the split signals are also changed in order to cancel any phase difference between adjacent signal paths.

Moreover, said phase difference may be measured by cross correlation between said adjacent signal paths. Thus, the phase difference can be measured easily and directly as the similarity of the signals processed in the adjacent signal paths is measured.

BRIEF DESCRIPTION OF DRAWINGS

The invention will now be described with reference to an exemplary embodiment that is shown in the drawings. In the drawings, FIG. 3 shows two frequency diagrams representing the split signals during different steps in a method for analyzing a high bandwidth of a radio frequency signal according to the invention, FIG. 6 shows a diagram showing an overlap area of two adjacent signals paths as used for a calibrating method according to the invention.

DETAILED DESCRIPTION OF EXAMPLE EMBODIMENT

Figure 1:
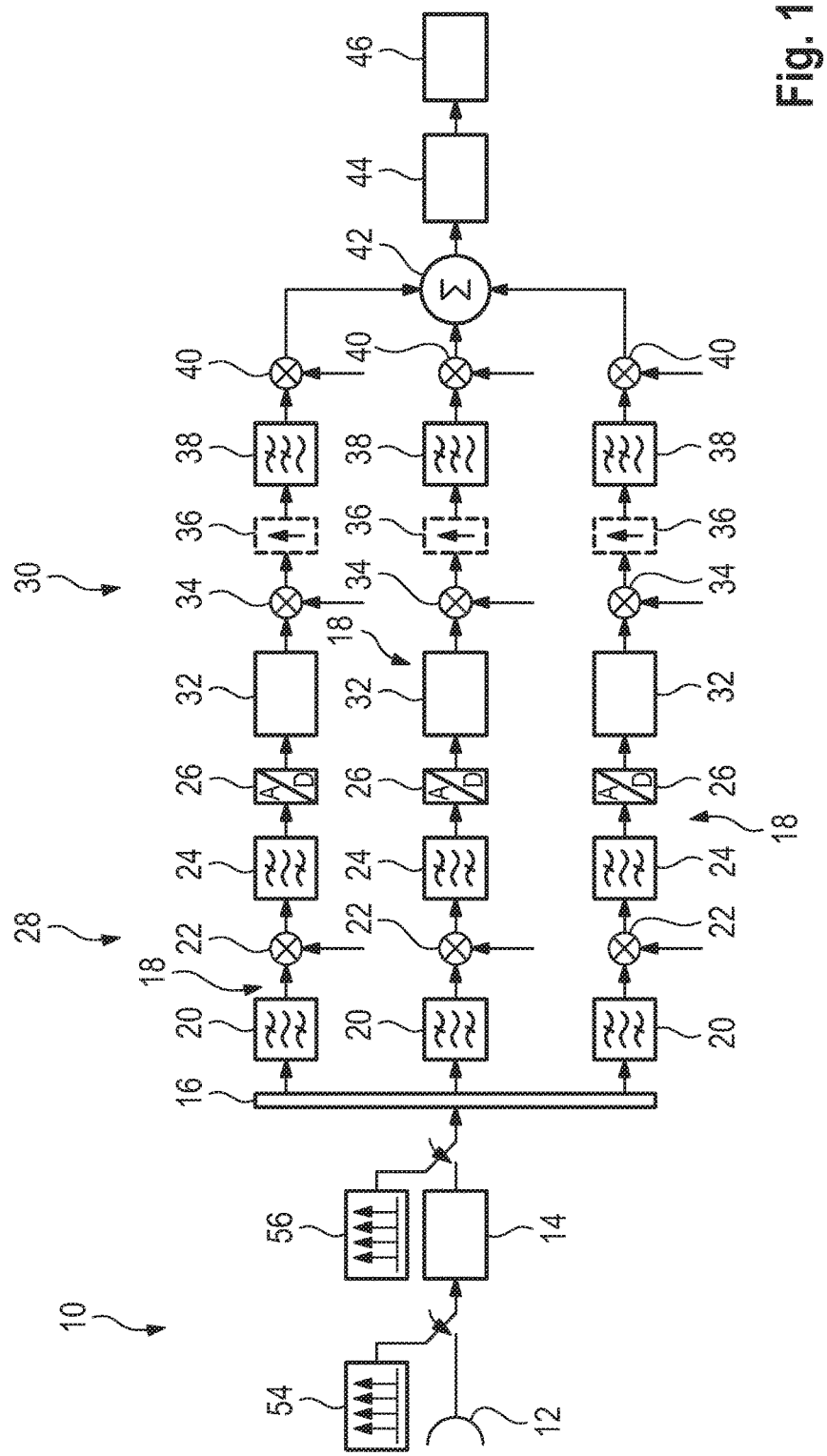
FIG. 1 shows a schematic overview of a test and measuring device according to the invention.

In FIG. 1, a test and measurement device 10 is schematically shown that is used for analyzing radio frequency signals, in particular radio frequency signals having a high bandwidth of at least 2 GHz.

The test and measurement device 10 comprises a radio frequency input 12 that is configured to receive the radio frequency signals that are processed by the test and measurement device 10. The radio frequency signal received is an analog one. Accordingly, the radio frequency input 12 is also an analog one.

The radio frequency input 12 is connected to a radio frequency converter 14 that is located directly downstream the radio frequency input 12 such that the radio frequency signal received is instantly forwarded to the radio frequency converter 14. The radio frequency converter 14 down-converts the radio frequency signal into a first intermediate frequency maintaining the bandwidth of the radio frequency signal. Hence, a first intermediate frequency signal is provided having a bandwidth of at least 2 GHz, for instance. The radio frequency converter 14 comprises at least one mixer. For instance, the radio frequency signal is down-converted into a first intermediate frequency signal having a first intermediate frequency of about 3290 MHz. In general, the first intermediate frequency is a fix one.

The radio frequency converter 14 is also connected to a splitter 16, in particular a power splitter, that is located downstream the radio frequency converter 14. The splitter 16 splits said first intermediate frequency signal into several split signals each having the first intermediate frequency of about 3290 MHz being fixed. Thus, the splitter 16 is connected to several signal paths 18 that are fed with the split signal appropriately. In the shown embodiment, the test and measurement device 10 comprises three different signal paths 18 so that three different split signals are processed by the test and measurement device 10.

Each of the signal paths 18 comprises a first filter 20 that is established by a bandpass filter, in particular a fixed bandpass filter with steep slope. Fixed bandpass filters can be used as the incoming signal is the first intermediate frequency signal having a fixed frequency. The first filters 20 each extract different sub-bands from the split first intermediate frequency signals received. Thus, the first filters are configured differently in order to obtain different sub-bands of the whole bandwidth of the first intermediate frequency signal.

In the shown embodiment, the different sub-bands each have a bandwidth of about 800 MHz wherein the spacing between the different sub-bands is approximately 700 MHz. Thus, the center frequency of the different first filters 20 is 2.59 GHz, 3.29 GHz and 3.99 GHz, respectively.

In general, the first filters 20 filter out different sub-bands of the whole bandwidth provided by the first intermediate frequency signal such that a fraction of each sub-band overlaps with at least one fraction of another sub-band partly. The sub-bands of adjacent signal paths 18 overlap partly, for instance by approximately 100 MHz in the shown embodiment. This overlapping of the different fractions is also shown in FIG. 3a. The three different sub-bands are referenced by paths 0, 1, 2 representing the different signal paths 18.

The first filters 20 assigned to each signal path 18 form a first filter set.

Then, the sub-bands are forwarded to first mixers 22 in each signal path 18. Accordingly, each signal path 18 is assigned with its own first mixer 22 such that a set of first mixers is provided. The first mixers 22 convert the split signals received from the first filters 20 into a second intermediate frequency such that second intermediate frequency signals are provided. Thus, the different sub-bands are shifted to a common frequency, namely the second intermediate frequency.

For instance, these second intermediate frequency signals have a frequency of about 600 MHz as shown in FIG. 3b.

The first mixers 22 may be established by local oscillators. Each first mixer 22 receives the corresponding split signal as a first input signal wherein each split signal is a corresponding sub-band. In addition, each first mixer 22 receives a second input signal for mixing purposes. These second input signals of the first mixers 22 are different with respect to each other in order to ensure that the different sub-bands each are converted into the second intermediate frequency being a common one.

Nevertheless, the first mixers 22 are phase-coupled such that a constant phase relationship of the first mixers 22 is ensured. The constant phase relationship may be provided by using a common source for the second input signals of each first mixer 22 as will be described later with reference to FIG. 2.

Then, the split signals being converted sub-bands are filtered again by second filters 24 wherein the second filters 24 limit the bandwidths of the different split signals for digitization purposes. In addition, images are filtered that might occur during the mixing processes.

Afterwards, the split signals are forwarded to corresponding analog to digital converters 26 that digitize the analog signals for digital processing. For instance, the signals are sampled by a sample rate of 2.4 GHz being higher than twice the bandwidth of a single subband (800 MHz).

Mixing the signals to an intermediate frequency and sampling the real signals avoid any in-phase and quadrature imbalances (I/Q imbalances) which would occur with direct mixing to baseband and sampling in-phase and quadrature separately.

The analog to digital converters 26 represent the interface between an analog domain 28 and a digital domain 30 of the test and measurement device 10. Accordingly, the analog domain 28 comprises the first filters 20, the first mixers 22, the second filters 24 as well as the analog to digital converters 26 at least partly. Accordingly, the signal paths 18 each have an analog signal path portion.

The digital domain 30 also comprises the analog to digital converters 26 at least partly and the components described in the following.

After their digitization, the split signals are filtered by third filters 32 being digital filters. The third filters 32 are configured to compensate frequency responses that have occurred in the analog domain 28, in particular in the analog portions of the signal paths 18. In addition, time delay and gain differences between the different signal paths 18 are compensated by the third filters 32 appropriately, in particular between adjacent signal paths 18.

Adjacent signal paths 18 are signal paths that process sub-bands being adjacent to each other with regard to their positions within the whole spectrum or bandwidth of the input signal.

In the shown embodiment, the third filters 32 are established by equalizers that typically have a simple design and are typically used for adjusting the balance between different frequency components.

Afterwards, the split signals are mixed down to their complex baseband. Therefore, second mixers 34 are provided that shift the split signals from the second intermediate frequency (600 MHz) to the complex baseband, respectively. Alternatively, the second mixers 34 may be positioned upstream the third filters 32.

Then, the shifted split signals each are forwarded to upsamplers 36 that are optionally provided. The upsamplers 36 might be used to adapt the sample rate to the full signal bandwidth of the first intermediate frequency signal provided that the sampling rate of the analog to digital converters 26 is lower than the bandwidth of the input signal.

In the shown embodiment, the sample rate of the analog to digital converters 26 is 2.4 GHz and the bandwidth of the input signal is 2 GHz. Thus, the upsamplers 36 are not required due to the fact that the bandwidth of the input signal is lower than the sample rate of the analog to digital converters 26.

After the optional upsampling step, the split signals are forwarded to fourth filters 38. These fourth filters 38 may be identical such that they pass the same bandwidth leading to identical spectra. Alternatively, the bandwidths of the fourth filters 38 may be different, e.g. the middle subband could be wider than the other subbands. Accordingly, other limiting bandwidths can be provided. The fourth filters 38 are configured such that overlap areas between adjacent split signals are established that correspond to the fractions of the different sub-bands overlapping with each other wherein the overlapping fractions are provided by the first filters 20.

Generally, the fourth filters 38 are used to remove unused side-bands in the split signals. In addition, the fourth filters 38 may form overlap areas of two adjacent split signals representing two adjacent sub-bands for calibration purposes as will be described later.

In the shown embodiment, the fourth filters 38 are established by synthesis filters that are typically used to reconstruct an original signal.

In general, the fourth filters 38 may have a slope being finite wherein the fourth filters 38 are symmetrical with regard to the limits of the corresponding signal path 18. In the shown embodiment, the fourth filters 38 are symmetrical with regard to the frequency of 350 MHz being the half of 700 MHz which is the spacing between neighbored subbands. The overlap areas of neighbored split signals each constitute 100 MHz. As mentioned above, the overlapping fractions provided by the first filters 20 also overlap with each other in a band of 100 MHz.

Figure 4:
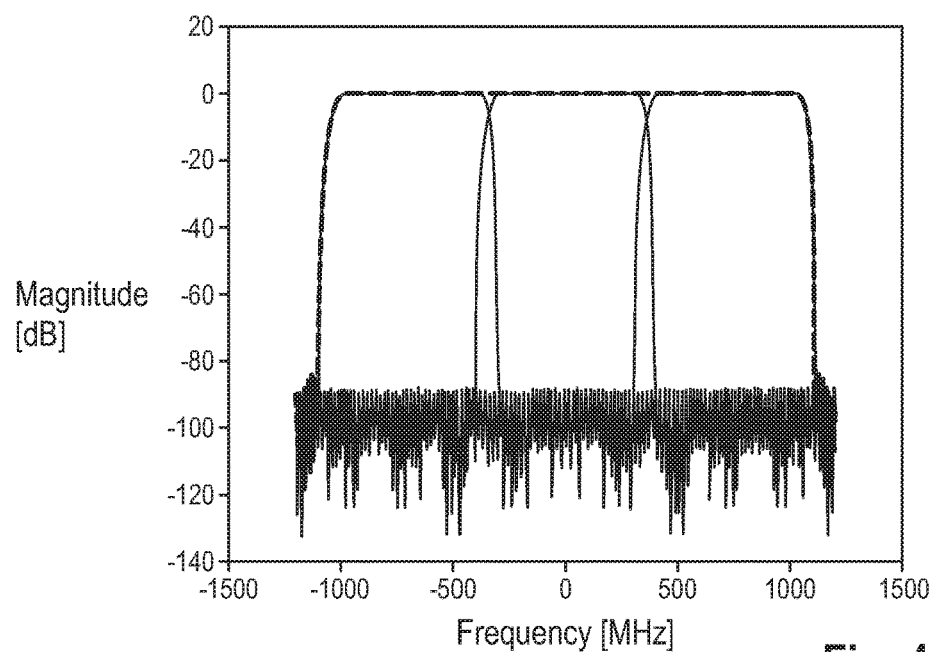
FIG. 4 shows a diagram representing the function of the used fourth filters.

In FIG. 4, the magnitudes of the fourth filters 38 are shown wherein the split signals are shifted back to their baseband. It becomes obvious that the fourth filters 38 are identical with regard to the bandwidth that is allowed to pass. In addition, the overlap area of the split signals processed in adjacent signal paths is easy to recognize that has been formed by the fourth filters 38 appropriately. Further, it is shown that the sum of the different spectra that passed through the fourth filters 38 provides a flat frequency response of the fourth filters 38. This is inter alia ensured by the overlap areas.

The third filters 32 formed by equalizers and the fourth filters 38 established by synthesis filters each are digital filters. However, the digital domain 30 comprises two different digital filter types performing different filtering steps.

In general, the frequency response, the time delay and the gain differences are compensated by the third filters 32 in a fast manner whereas the fourth filters 38 may remain constant as they are independent of the analog domain 28, in particular the analog portions of the signal paths 18. Thus, the fourth filters 38 do not have to be adapted with regard to the processing in the analog domain 28 in contrast to the third filters 32 that are adapted to changes within the analog domain 28 appropriately. In total, the adaption within the digital domain 30 is improved such that the parameter setting is accelerated.

After the split signals have been filtered by the fourth filters 38, the split signals are forwarded to third mixers 40 that shift the split signals back to their original positions with regard to each other and the total spectrum. Thus, the different sub-bands represented by the split signals are shifted back to their corresponding positions within the total spectrum of the first intermediate frequency signal, in particular the radio frequency signal.

Afterwards, the split signals being shifted back to their original positions within the total spectrum are recombined in a recombiner 42 such that an output signal is generated which represents the radio frequency signal that has been input to the radio frequency input 12. The recombiner 42 may comprise an adder. The recombined output signal has a spectrum that substantially corresponds to the one of the input signal.

In general, at least the signal paths 18 are formed on a common single circuit board, in particular the different components of the analog and digital domains 28, 30.

In the shown embodiment, the recombined and synthesized signal is down-converted or resampled by an output mixer 44 and then stored in a memory 46 being part of the test and measurement device 10.

Alternatively, the recombined signal can be forwarded to a subsequent real-time analyzing unit being part of the test and measurement device 10. Moreover, the subsequent real-time analyzing unit may be a separate device that is connected to the test and measurement device 10 such that it receives the recombined signal for analyzing purposes.

Accordingly, the test and measurement device 10 and the subsequent analyzing device form a test system.

In general, a test and measurement device is provided that can be used for analyzing high bandwidth radio frequency signals having a bandwidth of 2 GHz within a radio frequency spectrum that may be between 0 and 85 GHz.

Figure 2:
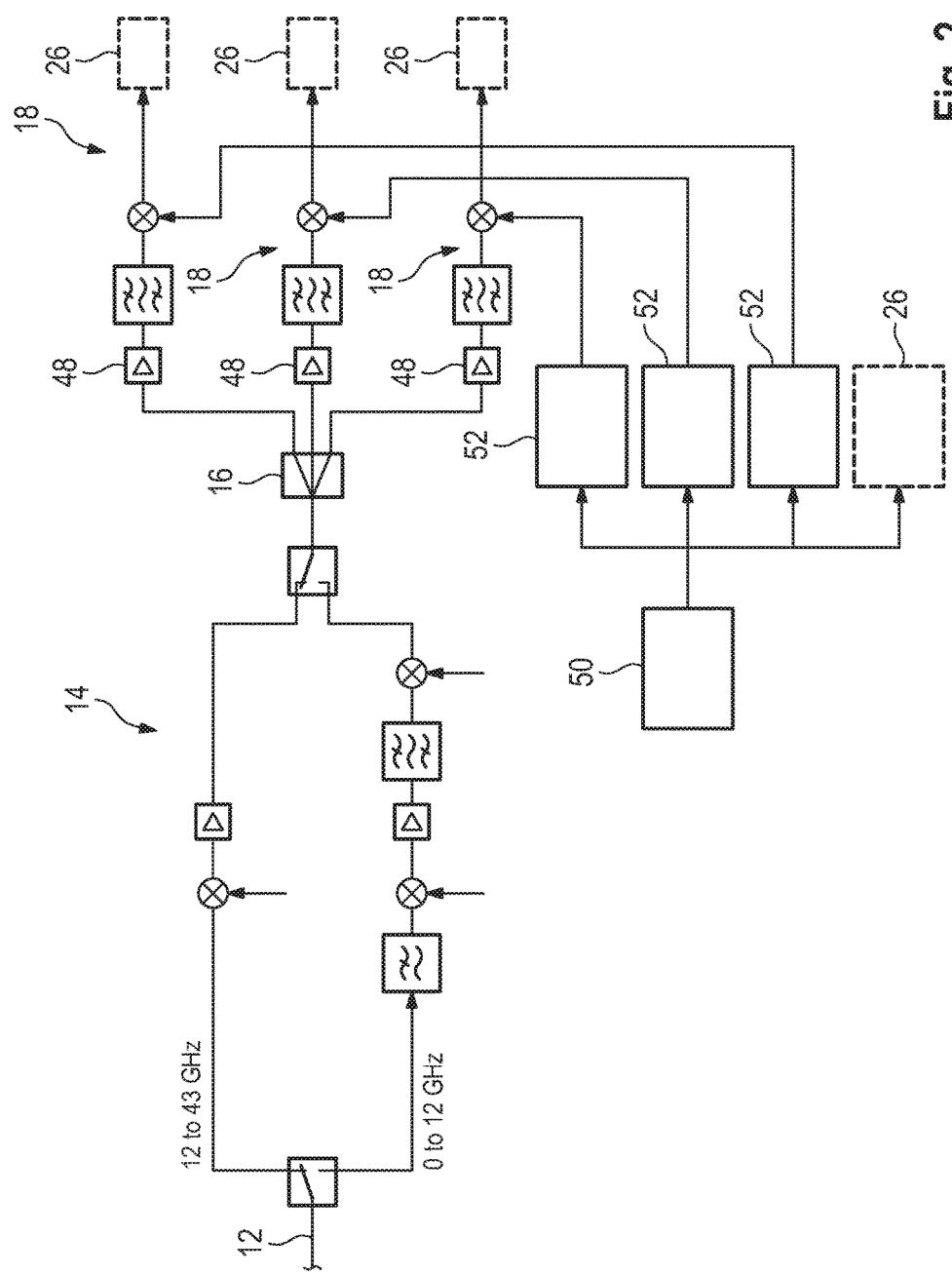
FIG. 2 shows a detailed overview of an analog domain of a test and measuring device according to the invention.

In FIG. 2, the analog domain 28 is shown in more detail, in particular the radio frequency converter 14.

The radio frequency signal is received via the radio frequency input 12. Depending on the frequency of the radio frequency signal, the radio frequency signal may be processed differently.

In the shown embodiment, the radio frequency signal having a high frequency is directly down-converted into the first intermediate frequency signal, for instance for input frequencies between 12 GHz and 43 GHz.

For lower frequencies (from 0 GHz to 12 GHz), the radio frequency signal may be filtered initially such that higher signal portions are cut. Then, the signal is up-converted into an intermediate frequency being higher than the input frequency and different to the first intermediate frequency. Afterwards, this up-converted signal is filtered by a bandpass filter and down-converted into the first intermediate frequency such that the first intermediate frequency signal is provided that is forwarded to the splitter 16. Due to the relative high intermediate frequency, no crossing spurs occur being higher order mixing products.

In addition, FIG. 2 illustrates that each signal path 18 comprises an isolation amplifier 48 that is positioned between the splitter 16 and the corresponding first filters 20.

These isolation amplifiers 48 improve the level flatness as reflected portions of signal portions being stopped by the subsequent first filters 20 are suppressed. In addition, the return loss is improved by the isolation amplifiers 48 with regard to input matching properties.

Furthermore, a common source 50 for the different first mixers 22 is shown wherein the different first mixers 22 are coupled to the common source 50. This ensures that the different first mixers 22 do no drift in phase over time with respect to each other as they receive their second input signals from the same source 50.

In the shown embodiment, the common source 50 is a 2.4 GHz clock source that is connected with each first mixer 22 such that the second input signals are forwarded to the first mixers 22. The different second input signals are provided by the common source 50 and phase-stable filters 52 that are positioned in the line between the common source 50 and the corresponding first mixers 22, respectively. The phase-stable filters 52 may be established by direct digital synthesizers. Accordingly, a phase stable synthesizer concept is provided for feeding the first mixers 22.

In the shown embodiment, the common source 50 and the phase-stable filters 52 provide second signals having the frequency of 3190 MHz, 3890 MHz and 4590 MHz ensuring the spacings of 700 MHz between the adjacent sub-bands generated by the first mixers 22.

In addition, the common source 50 is also connected to the analog to digital converters 26, in particular at least one clock of the analog digital converters 26.

Furthermore, the test and measurement device 10 can be calibrated easily while a method for calibrating is performed that is described hereinafter in detail.

In the shown embodiment, the test and measurement device 10 comprises a radio frequency calibration comb 54 and an intermediate frequency calibration comb 56 (FIG. 1). The radio frequency calibration comb 54 and the intermediate frequency calibration comb 56 are configured to output a radio frequency signal and an intermediate frequency signal for calibrating purposes, respectively.

In general, the test and measurement device 10 comprises two different calibration combs 54, 56 such that the influences with regard to intermediate and radio frequencies can be split, analyzed and compensated individually.

The radio frequency calibration comb 54 is positioned upstream the radio frequency converter 14 whereas the intermediate frequency calibration comb 56 is positioned downstream the radio frequency converter 14. Thus, the test and measurement device 10 having the intermediate frequency calibration comb 56 enables the possibility to calibrate the test and measurement device 10 with regard to its intermediate frequency characteristics independently of the radio frequency settings. In other words, the intermediate frequency path can be calibrated independent of the radio frequency path.

Accordingly, the settings of the radio frequency path can remain without any amendments while the settings of the components in the intermediate frequency path are calibrated, for instance the mixers and filters. For instance, it is not necessary to change the settings of the radio frequency converter 14 for calibrating purposes when using the intermediate frequency calibration comb 56.

Generally, the radio frequency response over 2 GHz, the intermediate frequency response of each signal path 18, the gain deviation between the different signal paths 18, the time delay between the different signal paths 18 and the phase deviations in the different signal paths 18 have to be calibrated and compensated, in particular in the analog domain 28 of the test and measurement device 10.

However, the phase deviations changes with each restart of the test and measurement device 10 whereas the other issues to be considered remain constant for a longer period such that they do not have to be calibrated so often. In other words, the calibration intervals may be longer for those issues.

According to the invention, the phase calibration is performed by sending an intermediate frequency calibration signal provided by the intermediate frequency calibration comb 56. Such a signal is shown in FIG. 3*a* by the dashed line.

Then, the phase differences between each pair of signals are measured that are processed in adjacent signal paths 18 in an overlap area 58 of the corresponding pair. The overlap area 58 of two signals processed in adjacent signal paths 18 is shown in FIG. 6 for illustrating purposes.

Initially, the intermediate frequency calibration signal is forwarded to the splitter 16 that splits the signal generated into several split signals that are processed as described above for the regular analyzing operation of the test and measurement device 10. Thus, these split signals are filtered, mixed and digitized wherein the second mixers 34 and the fourth filters 38 are configured to extract the corresponding overlap area 58 of a pair of adjacent signal paths 18.

Particularly, the overlap area 58 is formed by the fourth filters 38 creating different bands having overlapping portions.

In FIG. 6, the overlap area 58 is shown for two adjacent paths labeled by path 0 and path 1 that correspond to two adjacent sub-bands that have been filtered in a similar manner to the one shown in FIG. 3 wherein another input signal has been used, namely the intermediate frequency calibration signal generated by the intermediate frequency calibration comb 56.

Figure 5:
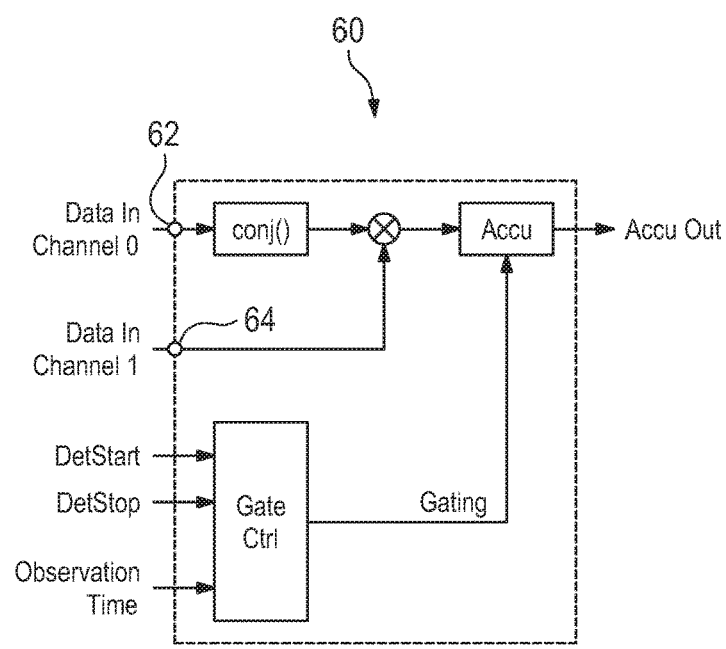
FIG. 5 shows a phase detector used for a calibrating method of the test and measuring device according to the invention.

The split signals within the overlap area 58 are forwarded to a phase detector 60 that is shown in FIG. 5.

The phase detector 60 may be part of the test and measurement device 10. Alternatively, the phase detector 60 can be formed separately with regard to the test and measurement device 10 such that it is a stand alone device that can be connected with the test and measurement device 10. Generally, the phase detector 60 can be formed by a field programmable gate array (FPGA).

As shown in FIG. 6, the phase detector 60 has a first input 62 and a second input 64 that are fed with the split signals of path 0 and path 1 respectively. The split signals of path 0 and path 1 represent two adjacent signal paths 18 of the test and measurement device 10. Particularly, only the signal portions of the split signals within the overlap area 58 are forwarded to the inputs 62, 64 for comparison purposes in order to accelerate the calibrating.

Then, the phase detector 60 calculates the correlation between the adjacent signal paths 18 (paths) over a certain observation time of a certain number of samples in real time such that the phase difference between the adjacent signal paths 18 can be estimated.

Then, the third mixers 40 may be set, in particular with regard to the phases, such that the phase differences can be compensated appropriately. Alternatively or additionally, the second mixers 34 are set accordingly.

Furthermore, the phase coefficients of the digital filters 32, 38 can be adjusted for compensating the phase differences.

Generally, the phase difference calibrating step is performed in the beginning of each ON-phase of the test and measurement device 10. Accordingly, the phase differences are compensated whenever the test and measurement device 10 is switched on.

Among the phase difference calibration, the frequency response can be calibrated in longer calibration intervals as described hereinafter.

In general, a test and measurement device 10 and a method for analyzing a radio frequency signal with a high bandwidth are provided. Furthermore, the test and measurement device 10 can be calibrated easily.

The invention claimed is:

1. A device comprising:
   a radio frequency input for receiving a radio frequency signal;
   a radio frequency converter to mix said radio frequency signal into a first intermediate frequency signal;
   a splitter to split said first intermediate frequency signal into several split signals;
   several signal paths for processing said several split signals; and
   a recombiner that is configured to recombine said split signals in order to create an output signal having a frequency span substantially representing said radio frequency signal,
   wherein said radio frequency converter is located between said radio frequency input and said splitter, and wherein a first set of mixers is provided, said first set of mixers comprising several first mixers each provided in a corresponding signal path of said several signal paths, said several first mixers each being configured to mix said split signals into second intermediate frequency signals.

2. The device according to claim 1, wherein a first filter set is provided, said first filter set comprising several first filters each provided in a corresponding signal path of said several signal paths, said several first filters each being configured to filter a portion of the bandwidth of said split signals.

3. The device according to claim 2, wherein each first filter is configured to filter out a portion of the bandwidth of said split signals in order to obtain a sub-band such that each sub-band has a fraction of the bandwidth of said first intermediate frequency signal being different to the fractions of the other sub-bands, each fraction overlapping with at least one fraction of another sub-band partly.

4. The device according to claim 1, wherein a second filter set is provided, said second filter set comprising several second filters each provided in a corresponding signal path of said several signal paths, said several second filters each being configured to filter images and to limit the bandwidth of said split signals.

5. The device according to claim 4, wherein a set of analog to digital converters is provided, said set of analog to digital converters comprising several analog to digital converters each provided in a corresponding signal path of said several signal paths, said several analog to digital converters each being configured to receive said split signals and to digitize said split signals, in particular said split signals being output from said several second filters each assigned to a corresponding analog to digital converter of said several analog to digital converters.

6. The test and measurement device according to claim 1, wherein a third filter set is provided, said third filter set comprising several third filters being programmable, said third filters each being provided in a corresponding signal path of said several signal paths, said several third filters each being configured to correct said split signals in magnitude and phase, in particular wherein said third filters are calibrated via a comb generator.

7. The device according to claim 1, wherein a second set of mixers is provided, said second set of mixers comprising several second mixers each provided in a corresponding signal path of said several signal paths, said several second mixers each being configured to mix said split signals into baseband.

8. The device according to claim 1, wherein a fourth filter set is provided, said fourth filter set comprising several fourth filters each being provided in a corresponding signal path of said several signal paths, said several fourth filters each being configured to remove side-bands and to form signal overlap areas in said split signals, in particular wherein an upsampler is provided prior to each fourth filter, said upsampler being configured to upsample said corresponding split signal prior to its recombination.

9. The device according to claim 1, wherein a third set of mixers is provided, said third set of mixers comprising several third mixers each provided in a corresponding signal path of said several signal paths, said several third mixers each being configured to convert said split signals to their original baseband positions with regard to the other split signals processed in the other signal paths and the radio frequency signal.

10. The device according to claim 1, wherein at least said several signal paths are formed on a common single circuit board.

11. A method for calibrating a device comprising:
a radio frequency input for receiving a radio frequency signal;
a radio frequency converter to mix said radio frequency signal into a first intermediate frequency signal;
a splitter to split said first intermediate frequency signal into several split signals;
several signal paths for processing said several split signals; and
a recombiner that is configured to recombine said split signals in order to create an output signal having a frequency span substantially representing said radio frequency signal, wherein said radio frequency converter is located between said radio frequency input and said splitter; and
the method comprising:
sending an intermediate frequency comb signal to several signal paths of said device;
measuring a phase difference between the signals of each pair of adjacent signal paths in an overlap area of said signals processed in said adjacent signal paths with regard to the bandwidth of said signals; and
correcting said phase difference using a set of mixers and/or a filter set.

12. The method according to claim 11, wherein said correcting is performed by adjusting the phases of mixers belonging to said set of mixers, in particular wherein said mixers are numerically controlled.

13. The method according to claim 11, wherein said correcting is performed by changing phase coefficients of filters belonging to said filter set.

14. The method according to claim 11, wherein said phase difference is measured by cross correlation between said adjacent signal paths.

15. A method for processing a radio frequency signal, the method comprising:
providing a radio frequency signal;
mixing said radio frequency signal to a first intermediate frequency signal;
splitting said first intermediate frequency signal into several split signals on different signal paths; and
combining said several split signals together in order to create an output signal having a frequency span substantially representing said radio frequency signal, wherein said split signals are filtered to limit the bandwidth of each split signal to a portion of the bandwidth of said first intermediate frequency signal, each portion overlapping partly with a portion of an adjacent split signal with regard to the frequency, in particular wherein said split signals each are mixed down to second, lower intermediate frequency signals.

16. The method according to claim 15, wherein each of said split signals are filtered in order to filter images of each split signal and to limit the bandwidth of each split signal and/or wherein each of said split signals is digitized.

17. The method according to claim 15, wherein said split signals each are filtered using a programmable filter in order to correct said split signals with regard to magnitude and phase, in particular wherein in a separate filter step unused side-bands are removed from said split signals and/or signal overlap areas are formed.

18. The method according to claim 15, wherein each of said split signals are mixed in order to correct their baseband positions relative to the other split signals.

* * * * *